United States Patent
Lu et al.

(10) Patent No.: US 8,054,994 B2
(45) Date of Patent: *Nov. 8, 2011

(54) METHOD AND APPARATUS FOR AUDIO NORMALIZATION

(75) Inventors: Phillip Lu, Kirkland, WA (US); Adil Sherwani, Seattle, WA (US); Kipley J. Olson, Mercer Island, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/551,357

(22) Filed: Aug. 31, 2009

(65) Prior Publication Data

US 2009/0323986 A1    Dec. 31, 2009

Related U.S. Application Data

(63) Continuation of application No. 10/658,349, filed on Sep. 9, 2003, now Pat. No. 7,596,234, which is a continuation-in-part of application No. 10/606,464, filed on Jun. 26, 2003, now Pat. No. 7,272,235.

(51) Int. Cl.
  *H03G 3/00* (2006.01)
(52) U.S. Cl. ........ 381/107; 381/106; 381/104; 381/102; 700/94
(58) Field of Classification Search .......... 381/104–109, 381/56–57, 101–103; 700/94
See application file for complete search history.

(56) References Cited

U.S. PATENT DOCUMENTS

| | | | |
|---|---|---|---|
| 4,434,325 A | 2/1984 | Kobayashi et al. | |
| 5,289,546 A * | 2/1994 | Hetherington | 381/104 |
| 5,890,017 A | 3/1999 | Tulkoff et al. | |
| 6,259,793 B1 | 7/2001 | Washio et al. | |
| 6,317,776 B1 * | 11/2001 | Broussard et al. | 709/204 |
| 6,498,855 B1 | 12/2002 | Kokkosoulis et al. | |
| 6,534,700 B2 | 3/2003 | Cliff | |
| 6,704,421 B1 * | 3/2004 | Kitamura | 381/103 |
| 6,807,450 B1 | 10/2004 | Takenaka et al. | |
| 7,072,477 B1 * | 7/2006 | Kincaid | 381/107 |
| 7,189,913 B2 | 3/2007 | Moulios et al. | |
| 7,272,235 B2 * | 9/2007 | Lu et al. | 381/104 |
| 7,596,234 B2 | 9/2009 | Lu et al. | |
| 2004/0005068 A1 | 1/2004 | Zeevi et al. | |
| 2004/0213420 A1 * | 10/2004 | Gundry et al. | 381/104 |
| 2009/0323986 A1 * | 12/2009 | Lu et al. | 381/107 |

OTHER PUBLICATIONS

Cohen, et al., "Automatic Amplitude Normalization of Speech", *IBM Technical Disclosure Bulletin*, vol. 16, No. 8, (Jan. 1974),pp. 2610-2611.

Penfold, R.A. "Stereo Automatic Fader", *Practical Wireless*, (Apr. 1980),pp. 24-51.

(Continued)

*Primary Examiner* — Devona Faulk
*Assistant Examiner* — Disler Paul

(57) ABSTRACT

A request is received to play an audio file. A determination is made regarding whether volume normalization parameters associated with the audio file are stored in a media library. If the volume normalization parameters associated with the audio file are stored in the media library, the volume normalization parameters are retrieved from the media library. If the volume normalization parameters associated with the audio file are not stored in the media library, retrieving the volume normalization parameters from the audio file. The volume normalization parameters are applied while playing the audio file. The volume normalization process can be applied across multiple audio files during playback.

18 Claims, 7 Drawing Sheets

OTHER PUBLICATIONS

Edwards, David "Easy-to-Build Unit Employs CMOS ICs", *Electronics Australia*, (Jan. 1978),pp. 48-51.
Duncan, Ben "A Semi-Automatic Disco Cross-Fader", *Practical Electronics*, (Jan. 1980),p. 38.
Arthur, P.R. "Automatic Fader", *Radio & Electronics Constructor*, (Sep. 1976),pp. 91-93.
"Final Office Action", U.S. Appl. No. 10/658,349, (Mar. 31, 2008),11 Pages.
"Final Office Action", U.S. Appl. No. 10/658,349, (Apr. 30, 2009),13 Pages.
"Non-Final Office Action", U.S. Appl. No. 10/658,349, (Aug. 23, 2007),9 Pages.
"Non-Final Office Action", U.S. Appl. No. 10/658,349, (Oct. 3, 2008),12 Pages.
"Notice of Allowance", U.S. Appl. No. 10/658,349, (Jul. 23, 2009),7 pages.

* cited by examiner

METHOD AND APPARATUS FOR AUDIO NORMALIZATION

RELATED APPLICATIONS

This application is a continuation of U.S. patent application Ser. No. 10/658,349, filed Sep. 9, 2003, entitled "Method and Apparatus for Playback of Audio Files", now U.S. Pat. No. 7,596,234, which is hereby incorporated by reference herein in its entirety. U.S. patent application Ser. No. 10/658,349 is a continuation in part of U.S. patent application Ser. No. 10/606,464, filed Jun. 26, 2003, entitled "Method and Apparatus for Audio Normalization", now U.S. Pat. No. 7,272,235, which is hereby incorporated by reference herein in its entirety.

BACKGROUND

Computer systems are being used today to store various types of media, such as audio data, video data, combined audio and video data, and streaming media from online sources. Media clips recorded from or obtained from different sources often have widely varying volume levels. For example, an audio file copied from a Compact Disc (CD) may have a particular volume level and an audio file downloaded from an online music source may have a significantly different volume level. If the difference in volume levels between two audio files is significant, a user will notice the difference in volume when the two audio files are played sequentially.

A user can play audio data through a computer system using, for example, a media player application. If the volume between different songs or media clips is significant, the user can manually adjust the volume for each song or media clip such that the volume is at the desired level. This approach is annoying to the user of the computer and distracts the user from their other activities.

Accordingly, it is desirable to provide an audio playback mechanism that automatically adjusts the volume of different sets of audio data (e.g., media clips) such that the playback volume is substantially constant across a list of different audio data.

SUMMARY

The systems and methods described herein normalize volume levels across multiple audio files. In a particular embodiment, a request is received to play an audio file. A process determines whether volume normalization parameters associated with the audio file are stored in a media library. If so, the volume normalization parameters are retrieved from the media library. If the volume normalization parameters associated with the audio file are not stored in the media library, the volume normalization parameters are retrieved from the audio file. The volume normalization parameters are applied while playing the audio file.

BRIEF DESCRIPTION OF THE DRAWINGS

Similar reference numbers are used throughout the figures to reference like components and/or features.

DETAILED DESCRIPTION

The systems and methods discussed herein normalize audio data during playback. Normalization is also referred to as "volume leveling". Normalization of audio data adjusts the average volume of audio data such that the playback volume is substantially constant across multiple audio files. The systems and methods described herein can be applied during, for example, media playback, media recording (e.g., "burning" a CD or DVD) and media scanning or analysis. This normalization of audio data eliminates the need for the user to manually adjust the volume for different media clips or other audio files.

In a specific embodiment, a volume normalization process is applied across multiple audio files during playback. As discussed herein, volume normalization parameters can be calculated at different times, such as during playback of an audio file, when copying an audio file, when scanning a media library, or during media recording.

As used herein, the term "media clip" describes any sequence of audio data, video data, combined audio and video data, etc. A "media clip" may also be referred to as an "audio clip", a "video clip", or a "song". As used herein, the term "audio file" describes any sequence of audio data having any length. An "audio file" may contain other information in addition to audio data, such as configuration information, associated video data, and the like. An "audio file" may also be referred to as a "media file".

Although particular examples discussed herein refer to playing or copying audio data from CDs, the systems and methods described herein can be applied to any audio data obtained from any source, such as CDs, DVDs (digital video disks or digital versatile disks), video tapes, audio tapes and various online sources. The audio data processed by the systems and methods discussed herein may be stored in any format, such as a raw audio data format or a compressed format such as WMA (Windows Media Audio), MP3 (MPEG, audio layer 3), WAV (a format for storing sound in files; uses ".wav" filename extension), WMV (Windows Media Video), or ASF (Advanced Streaming Format).

Figure 1:
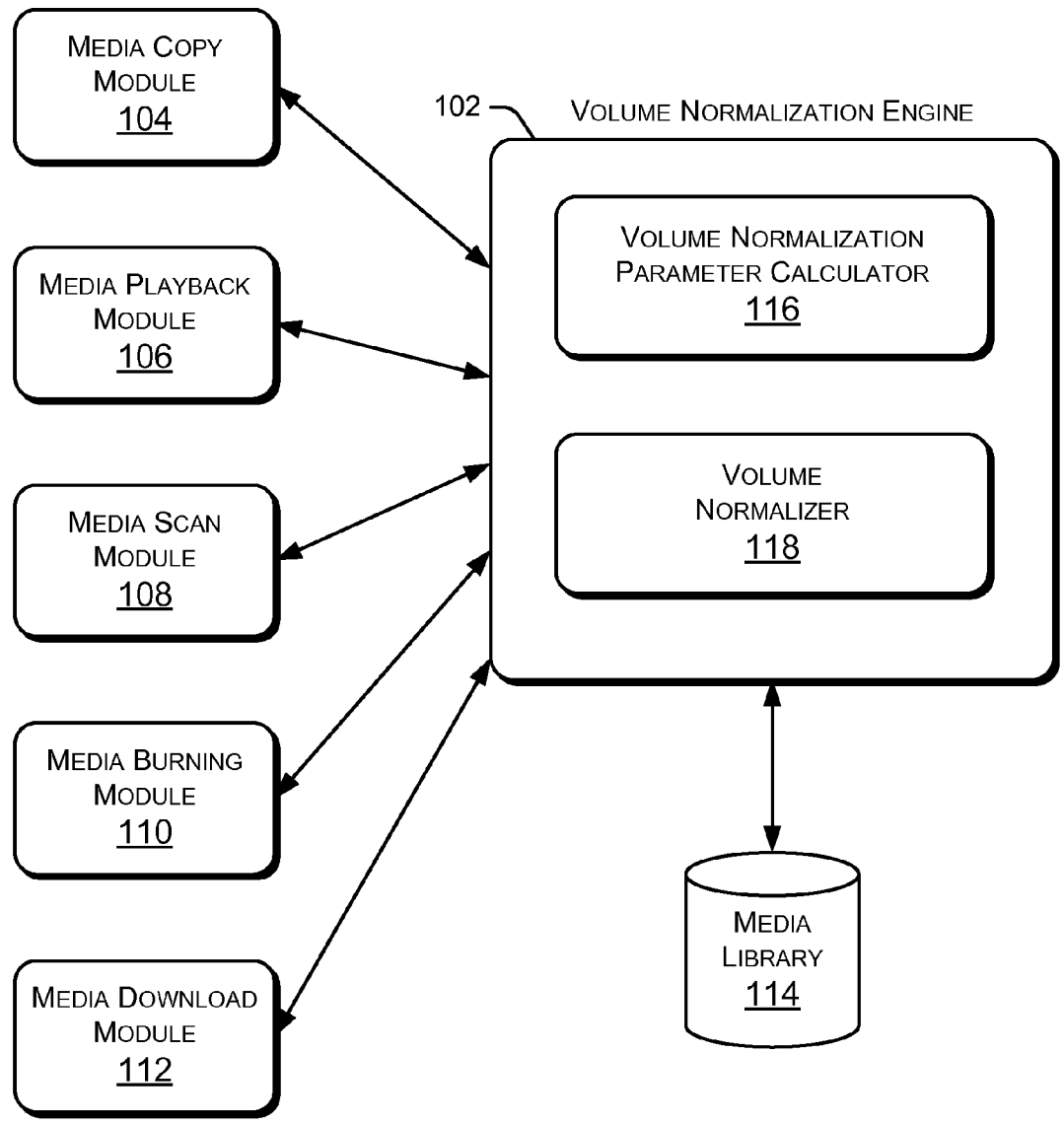
FIG. 1 is a block diagram illustrating an example of various components that can be used to normalize volume levels among multiple media files or other media data.

FIG. 1 is a block diagram illustrating an example of various components that can be used to normalize volume levels (also referred to as audio levels) among multiple media files or other media data. The various components shown in FIG. 1 may be included in a media player application such as the Windows Media Player available from Microsoft Corporation of Redmond, Wash. A volume normalization engine 102 is coupled to a media copy module 104, a media playback module 106, a media scan module 108, a media burning module 110 and a media download module 112. Volume normalization engine 102 normalizes volume levels among multiple media files, media clips, etc. Media copy module 104 allows a user to copy an audio file from, for example, a CD to a computer hard drive (or other storage device) such that the audio file can be played back through the computer's speakers. This process of copying an audio file from a CD to a computer hard drive is commonly referred to as "ripping".

Media copy module 104 may also allow a user to copy an audio file from a computer hard drive to a portable device, such as a WMA or MP3 player.

Media playback module 106 plays audio and/or video data from a CD, DVD, computer hard drive, or other source. Typically, media player module 106 plays audio data through a computer's speakers and plays video data on the computer's monitor. Media scan module 108 scans storage devices coupled to a computer system for audio and/or video files and categorizes those audio and/or video files. Media scan module 108 is typically executed when a media player is installed on a new computer or when a user wants to update a listing of all audio and/or video files on the computer. Media scan module 108 generally scans hard drives, CD-ROM drives, DVD drives, other drives containing removable media, and any portable devices coupled to the computer.

Media burning module 110 controls the recording of data (such as audio and video data) on a recordable media, such as a recordable CD or a recordable DVD. The process of recording a CD or a DVD is commonly referred to as "burning" a CD or DVD. Media burning module 110 may record data from multiple sources onto a single CD or DVD. For example, a collection of audio data stored on a CD may be from another CD, an online source, and from an audio track on a DVD.

Media download module 112 allows users to download media content from various sources, such as web sites, music download services, or data storage mechanisms accessible via, for example, a data communication network. As media content is downloaded by media download module 112, various volume normalization parameters are computed and saved.

Volume normalization engine 102 is also coupled to a media library 114, which stores normalization parameters associated with multiple audio files. Additional details regarding these normalization parameters are discussed below. Media library 114 may also contain configuration information, audio data, video data, and other data used by volume normalization engine 102 and the media player application.

Volume normalization engine 102 includes a volume normalization parameter calculator 116 and a volume normalizer 118. Volume normalization parameter calculator 116 analyzes audio data and calculates one or more volume normalization parameters that are applied to the audio data during playback such that the volume of the audio data is normalized with the volume of other audio data. These volume normalization parameters are stored in media library 114 along with an identifier of the audio data with which the parameters are associated. The volume normalization parameters are applied by volume normalizer 118 during playback of the audio data to normalize the playback volume of the audio data. Volume normalizer 118 may work in combination with media playback module 106 to play audio data with a normalized playback volume.

Figure 2:
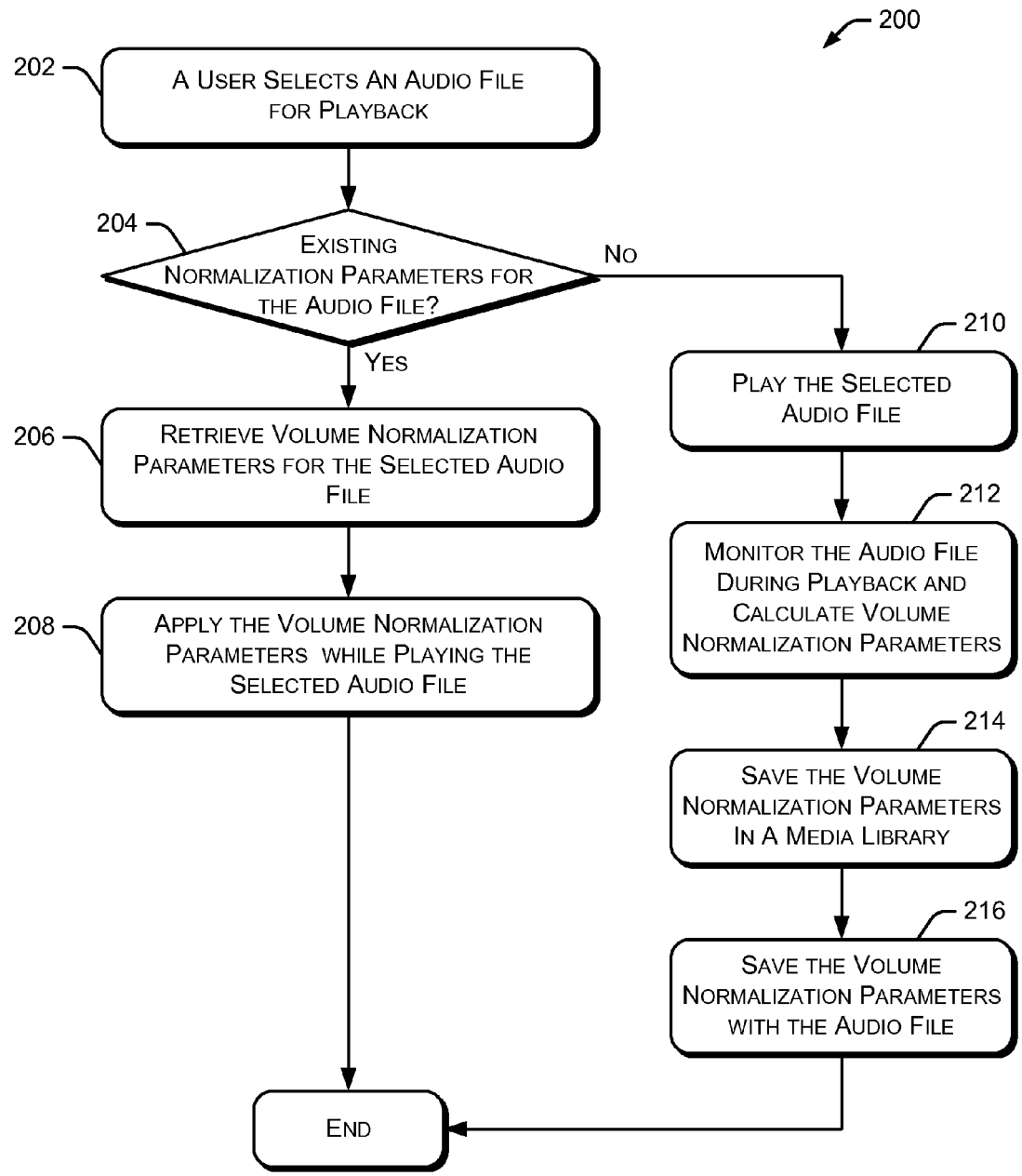
FIG. 2 is a flow diagram illustrating an embodiment of a procedure for playing an audio file.

FIG. 2 is a flow diagram illustrating an embodiment of a procedure 200 for playing an audio file. Initially, a user selects an audio file for playback (block 202). The procedure 200 then determines whether existing volume normalization parameters are available for the audio file (block 204). This determination is made by first checking the media library (e.g., media library 114 in FIG. 1) for volume normalization parameters associated with the selected audio file. If the media library does not contain volume normalization parameters associated with the selected audio file, the audio file itself is checked for volume normalization parameters. In some situations, the volume normalization parameters are stored in the audio file when the audio file is created or added to the audio file at a later time. As discussed in greater detail below, example volume normalization parameters include peak volume value and average volume level.

If volume normalization parameters are located in the media library or in the audio file itself, the procedure continues from block 204 to block 206, where the procedure retrieves the volume normalization parameters associated with the selected audio file. The volume normalization parameters are then applied while playing the selected audio file (block 208).

If volume normalization parameters are not located in the media library or in the audio file itself, the procedure branches from block 204 to block 210, where the procedure plays the selected audio file. While playing the selected audio file, the procedure monitors the audio file and calculates volume normalization parameters (block 212). When playback of the audio file is complete, the volume normalization parameters are stored in a media library (block 214) and stored with the audio file (block 216). Storing the volume normalization parameters "with the audio file" includes editing the audio file to include the parameters or storing the parameters in another file adjacent to or associated with the audio file. In one embodiment, the volume normalization parameters are stored in a header of the audio file. In certain situations, the audio file cannot be edited and the parameters cannot be stored with the audio file. In these situations, the volume normalization engine relies on the volume normalization parameters stored in the media library during playback of the audio file.

Figure 3:
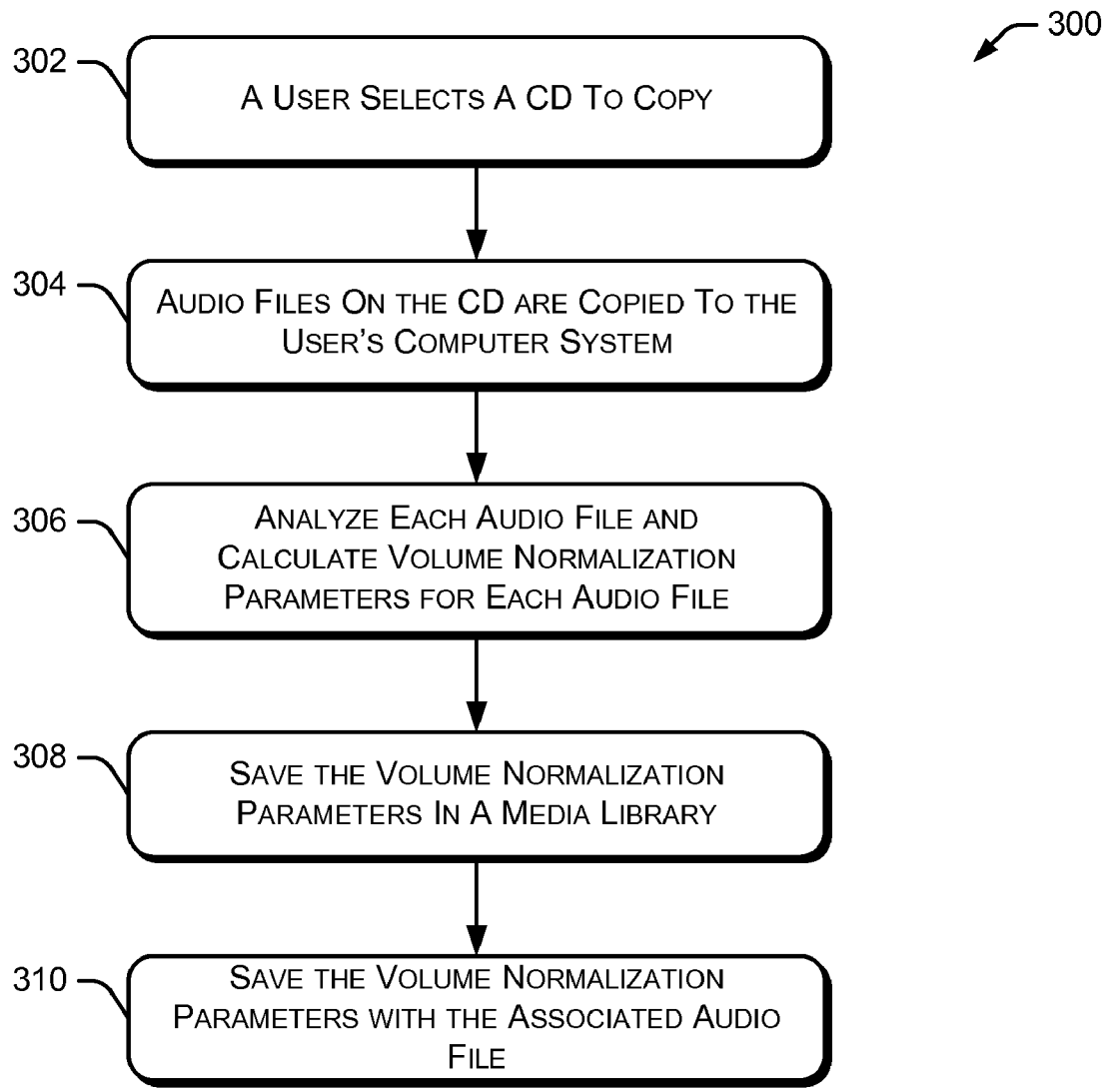
FIG. 3 is a flow diagram illustrating an embodiment of a procedure for copying a CD.

FIG. 3 is a flow diagram illustrating an embodiment of a procedure 300 for copying a CD. Initially, a user selects a CD (or other storage media) to copy (block 302). Audio files on the selected CD are copied to the user's computer system (block 304), such as the computer system's hard disk drive. The procedure then analyzes each audio file and calculates one or more volume normalization parameters for each audio file (block 306). The volume normalization parameters are then saved in a media library (block 308) and saved with the associated audio file (block 310), if possible. The volume normalization parameters may be saved in the audio file itself, saved adjacent to the audio file, or saved in the proximity of the audio file.

Although blocks 304 and 306 in FIG. 3 are shown as two separate functions or operations, in a particular embodiment during the process of copying audio files from a CD, the audio data passes through a normalization procedure before they are encoded and written to the disk drive. The normalization engine calculates the normalization parameters as the audio files are transferred from the CD to the disk drive.

In the example of FIG. 3 above, all audio files on the CD are copied to the computer system. In alternate embodiments, a user may select one or more of the audio files on the CD to copy to the computer system. For example, the user may select their favorite songs from the CD to be copied to the computer system.

In an alternate embodiment of FIG. 3, the procedure first checks to see whether volume normalization parameters already exist for each audio file. If the parameters do not exist in the media library or with the audio file, then the procedure is followed as discussed above. However, if the volume normalization parameters exist in the media library or with the audio file, the procedure does not recreate the parameters. Instead, the procedure uses the existing volume normalization parameters.

Figure 4:
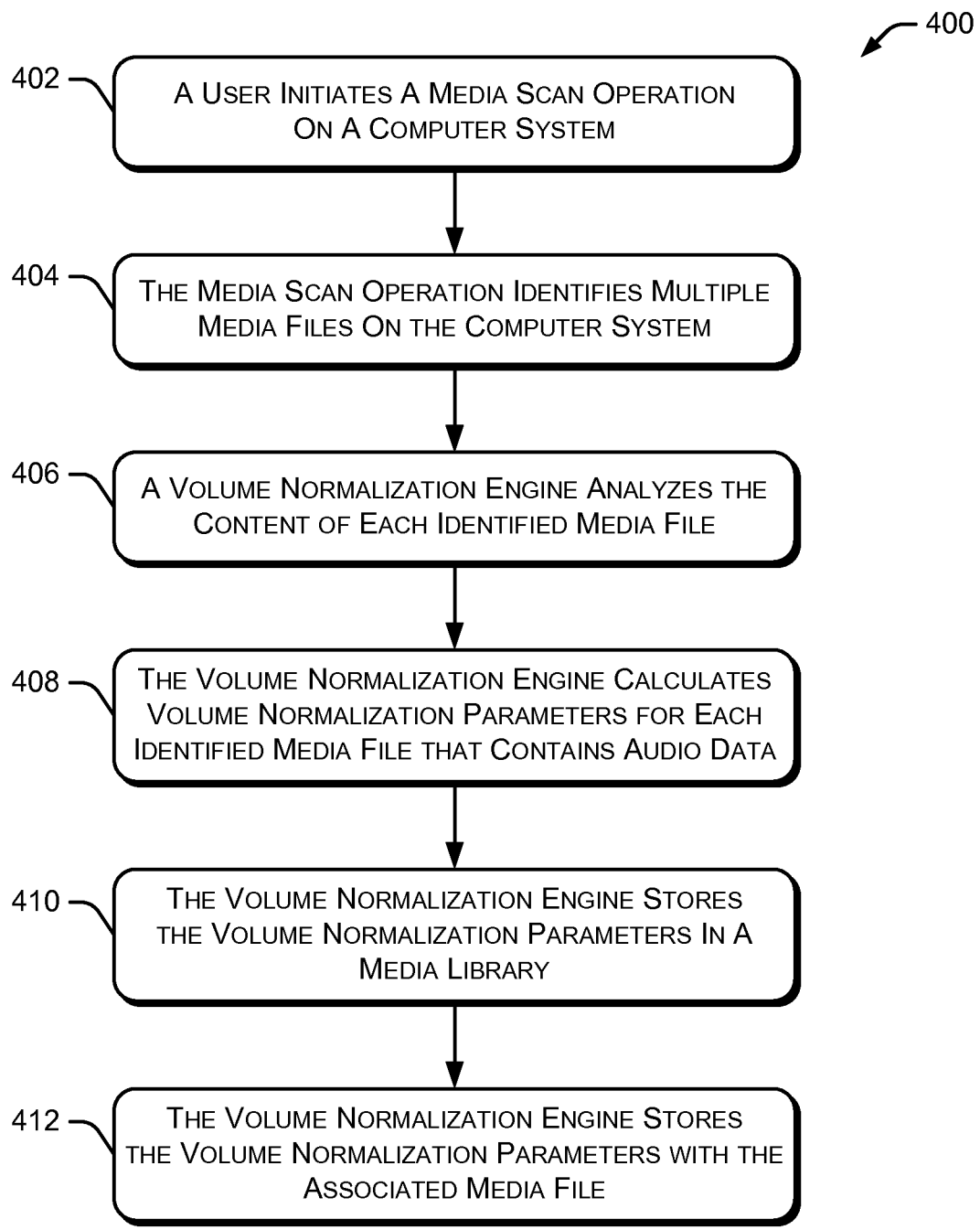
FIG. 4 is a flow diagram illustrating an embodiment of a procedure for scanning media on a computer system.

FIG. 4 is a flow diagram illustrating an embodiment of a procedure 400 for scanning media on a computer system. Initially, a user initiates a media scan operation on a computer system (block 402). The media scan operation identifies multiple media files on the computer system (block 404). The identified media files may include audio files, video files, and the like. A volume normalization engine analyzes the content of each identified media file (block 406). The volume normalization engine calculates volume normalization parameters for each identified media file that contains audio data (block 408). The volume normalization engine stores the volume normalization parameters in a media library (block 410) and stores the volume normalization parameters with the associated media file (block 412). The volume normalization parameters may be stored in the media file itself, stored adjacent to the media file, or stored in the proximity of the media file.

In another embodiment, the volume normalization engine stores the volume normalization parameters in the media library, as mentioned above with respect to block 410. However, instead of storing the volume normalization parameters with the associated media file (e.g., block 412), the volume normalization parameters are copied from the media library to the associated media file (if the media file is an editable file) at a later time.

In one embodiment, a media scan operation identifies media files on the computer system that were not identified during a previous media scan. This embodiment saves the computer system from re-analyzing media files and re-calculating volume normalization parameters unnecessarily.

In another embodiment, a media scan operation is performed periodically to identify any new media files in the computer system. These periodic media scans keep the media library and the media listings provided by the media player application current.

In a particular embodiment, a user may create (e.g., "burn") an audio CD with one or more audio tracks. The volume normalization system attempts to retrieve volume normalization parameters from the media library and from the audio files to be recorded on the CD. If the volume normalization parameters are not available for a particular audio file, the volume normalization system scans the audio file and calculates the volume normalization parameters. The volume normalization system then scans the audio file a second time to copy the audio file to the CD while applying the volume normalization parameters calculated during the first scan of the audio file. The resulting audio CD contains one or more audio files that have been normalized across the audio CD.

In another embodiment, a user may download one or more audio files from an online source, such as an online music download service. As the audio files are downloaded, the volume normalization system attempts to retrieve volume normalization parameters from the media library and from the audio files being downloaded. If the volume normalization parameters are not available for a particular audio file, the volume normalization system scans the audio file and calculates the volume normalization parameters as the file is downloaded. The volume normalization system then saves the volume normalization parameters in the media library and/or in the downloaded audio file.

Figure 5:
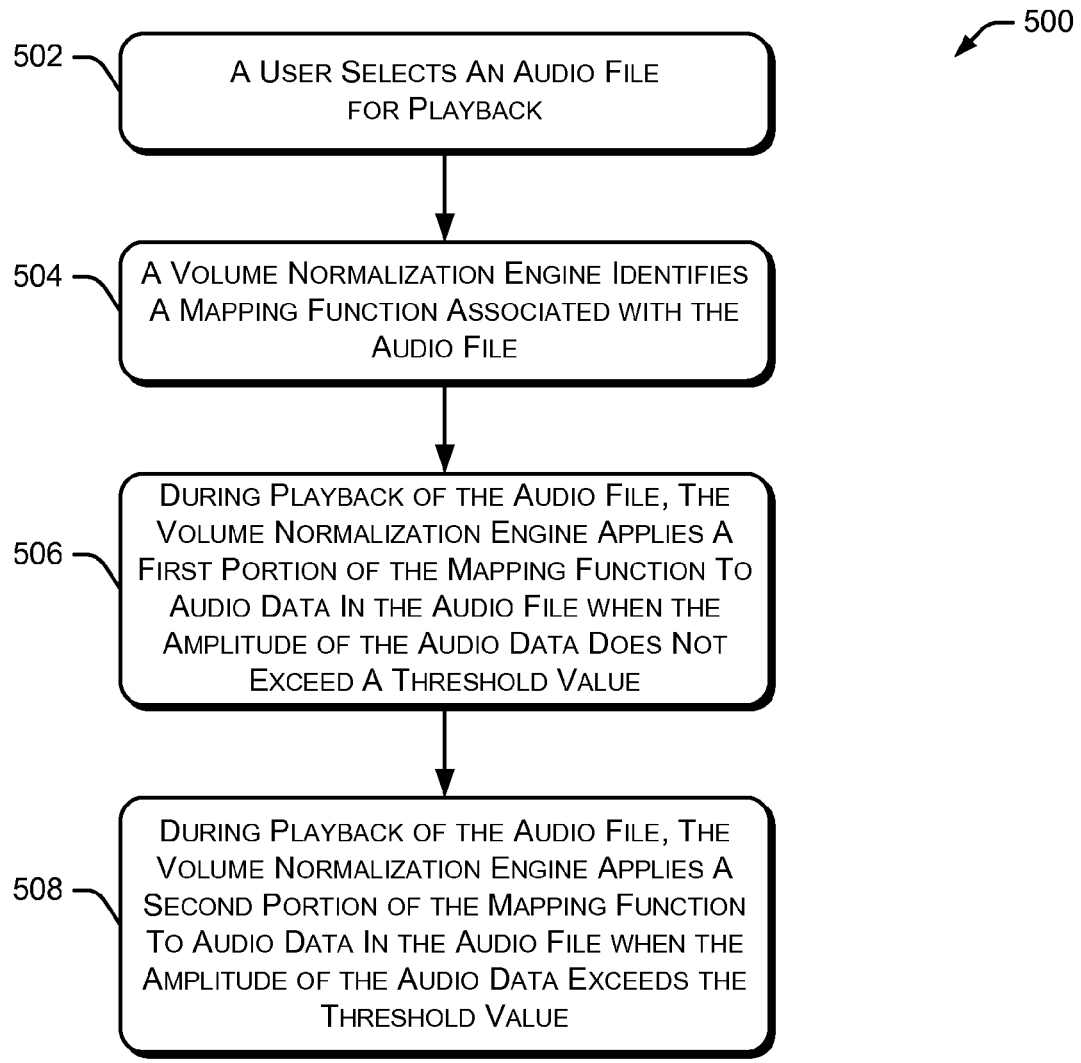
FIG. 5 is a flow diagram illustrating an embodiment of a procedure for normalizing volume levels for an audio file during playback.

FIG. 5 is a flow diagram illustrating an embodiment of a procedure 500 for normalizing volume levels for an audio file during playback. Initially, a user selects an audio file for playback (block 502). A volume normalization engine identifies a mapping function associated with the audio file (block 504). The mapping function can be stored in a media library, stored in the audio file, or stored with the audio file. The mapping function maps an input sample to an output sample in a smooth and continuous manner. During playback of the audio file, the volume normalization engine applies a first portion of the mapping function to audio data in the audio file when the amplitude of the audio data does not exceed a threshold value (block 506). Similarly, during playback of the audio file, the volume normalization engine applies a second portion of the mapping function to audio data in the audio file when the amplitude of the audio data exceeds the threshold value (block 508). Calculation and application of the mapping function are discussed in greater detail below. In a particular embodiment, the same mapping function is used throughout an entire song or audio file.

The systems and methods discussed herein calculate volume normalization parameters at various times, such as during CD ripping, media scans, and the first time a particular media file is played by the computer system. The normalization parameters are applied in real-time during playback of the audio data. In many cases, the normalization parameters are stored in or stored with the associated audio file. Therefore, if the audio file is copied to a new computer system, the normalization parameters are readily available to the new computer system without requiring any additional analysis or calculations. However, certain audio files are read-only and/or are stored on a read-only media (such as a CD-ROM disc). In this situation, the normalization parameters associated with the audio files are available from the media library.

In one embodiment, a volume normalization algorithm uses two primary parameters: peak volume value and average volume level for a particular audio file. These values can be calculated from the PCM (Pulse Code Modulation) samples in the audio stream. PCM is a sampling technique for digitizing analog signals. In a particular embodiment, the average volume level is the rms (root mean square) value of the samples. Root mean square is a method of defining the voltage or current associated with an alternating waveform.

The range of audio volumes that can be reproduced is limited. If the volume level exceeds a maximum point, the actual volume will remain at that maximum point, thereby "clipping" the audio signal. "Clipping" of the audio signal may also be referred to as "clamping" the audio signal. The peak volume parameter is used to ensure that data samples (after scaling) do not have amplitudes that go beyond the valid data range for a particular sample bit depth. If an overflow occurs, a smoothly curved mapping function is applied to the samples. The effect of this mapping (which is also referred to as limiting) is to compress the dynamic range of the samples such that overflow no longer occurs, thereby avoiding "clipping".

Certain types of music, such as classical music, can have a low average volume, but a high peak volume. In this situation, raising the rms value to the desired level may also require excessive compression near the peak volume, which results in noticeable distortion in the resulting normalized music. To avoid this distortion when the peak-to-rms ratio is too high, the normalization algorithm also uses the peak value to determine the mapping function.

Figure 6:
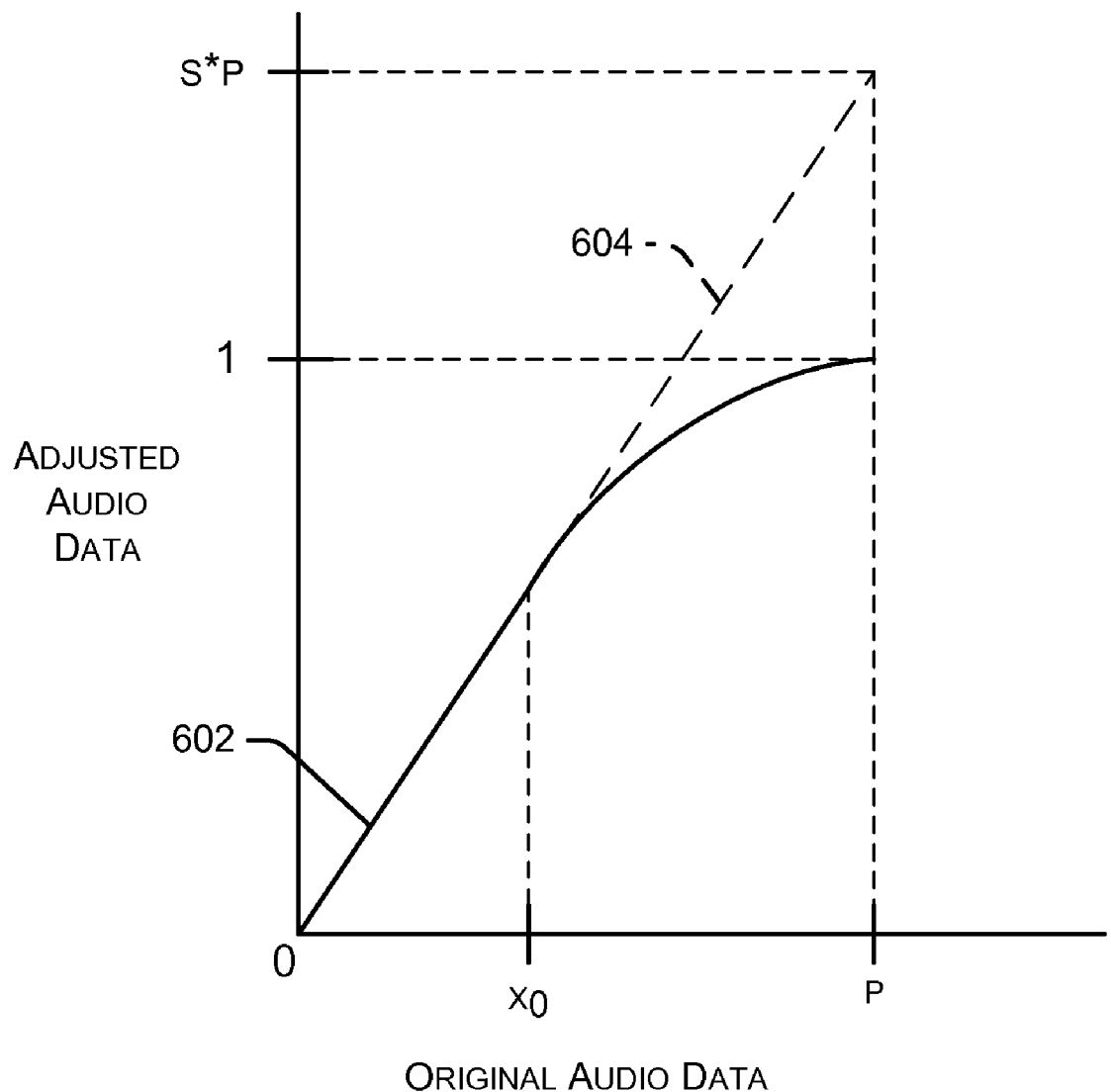
FIG. 6 is a graph illustrating the manner in which audio data is modified to avoid "clipping" the audio output signal.

FIG. 6 is a graph illustrating the manner in which audio data is modified to avoid "clipping" the audio output signal. FIG. 6 illustrates a mapping curve 602 associated with a mapping function. The mapping function has a first portion (the bottom portion) that is substantially linear and is equivalent to linear scaling. This first portion is applied to the majority of the samples that have relatively low magnitudes (e.g., volumes). The second portion of the mapping function (the upper portion) is a quadratic function that gradually compresses the upper part of the dynamic range. As compared to abrupt clipping, smoothing of the samples reduces distortion in the resulting audio signal.

As shown in FIG. 6, broken line 604 shows how the linear approach would continue until a threshold value is reached (the value "1" on the vertical axis), at which point clipping would occur. A variable $x_0$ on the horizontal axis identifies the point at which the mapping function changes from the first portion to the second portion.

The mapping function can be implemented efficiently. Typically, the majority of the samples require linear scaling, which needs one floating point multiplication. For the samples near the peak value, the quadratic function requires three floating point multiplications. The following normalization algorithm assumes that the sample values are expressed as floating point values in the range of [−1, 1]. In one embodiment, the normalization algorithm is defined as follows:

$$y = s*x \text{ (when } 0 \leq x \leq x_0)$$

$$y = s*x - c*(x-x_0)^2 \text{ (when } x_0 \leq x \leq p)$$

where:
 x=original value of a sample
 y=value of the normalized sample
 p=source peak value, computed from the samples
 rms=source rms value, computed from the samples
 R=desired target rms level, a pre-determined constant (e.g., 0.15)
 T=threshold for scaled peak value, a pre-determined constant (e.g., 1.50)
 s=min [R/rms, T/p]
 $x_0 = (2-s*p)/s$
 $c = s^2/(4*(s*p-1))$ In a particular implementation of this normalization algorithm, the maximum compression is approximately 0.667 (or −3.5 dB), which is relatively insignificant. This maximum occurs when the source peak value is 10 times (20 dB) over the source average value. For popular music, the peak value is typically 6-12 dB above the average value. Certain classical and jazz recordings may have peak values over 20 dB above the average value. In these situations, the target volume level is lowered and the amount of compression is capped at −3.5 dB.

Figure 7:
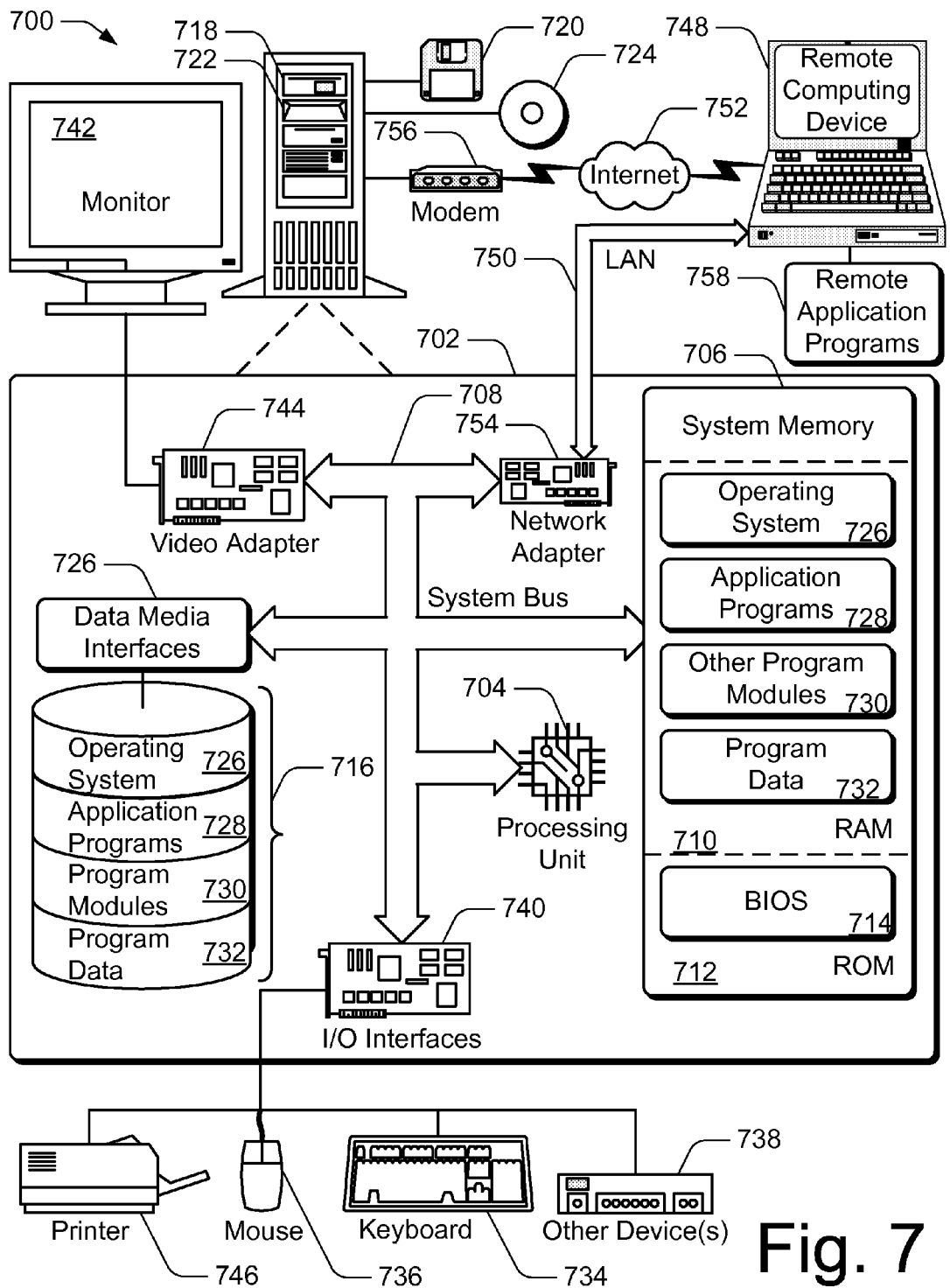
FIG. 7 illustrates a general computer environment, which can be used to implement the techniques described herein.

FIG. 7 illustrates a general computer environment 700, which can be used to implement the techniques described herein. The computer environment 700 is only one example of a computing environment and is not intended to suggest any limitation as to the scope of use or functionality of the computer and network architectures. Neither should the computer environment 700 be interpreted as having any dependency or requirement relating to any one or combination of components illustrated in the example computer environment 700.

Computer environment 700 includes a general-purpose computing device in the form of a computer 702. One or more media player applications can be executed by computer 702. The components of computer 702 can include, but are not limited to, one or more processors or processing units 704 (optionally including a cryptographic processor or co-processor), a system memory 706, and a system bus 708 that couples various system components including the processor 704 to the system memory 706.

The system bus 708 represents one or more of any of several types of bus structures, including a memory bus or memory controller, a peripheral bus, an accelerated graphics port, and a processor or local bus using any of a variety of bus architectures. By way of example, such architectures can include an Industry Standard Architecture (ISA) bus, a Micro Channel Architecture (MCA) bus, an Enhanced ISA (EISA) bus, a Video Electronics Standards Association (VESA) local bus, and a Peripheral Component Interconnects (PCI) bus also known as a Mezzanine bus.

Computer 702 typically includes a variety of computer readable media. Such media can be any available media that is accessible by computer 702 and includes both volatile and non-volatile media, removable and non-removable media.

The system memory 706 includes computer readable media in the form of volatile memory, such as random access memory (RAM) 710, and/or non-volatile memory, such as read only memory (ROM) 712. A basic input/output system (BIOS) 714, containing the basic routines that help to transfer information between elements within computer 702, such as during start-up, is stored in ROM 712. RAM 710 typically contains data and/or program modules that are immediately accessible to and/or presently operated on by the processing unit 704.

Computer 702 may also include other removable/non-removable, volatile/non-volatile computer storage media. By way of example, FIG. 7 illustrates a hard disk drive 716 for reading from and writing to a non-removable, non-volatile magnetic media (not shown), a magnetic disk drive 718 for reading from and writing to a removable, non-volatile magnetic disk 720 (e.g., a "floppy disk"), and an optical disk drive 722 for reading from and/or writing to a removable, non-volatile optical disk 724 such as a CD-ROM, DVD-ROM, or other optical media. The hard disk drive 716, magnetic disk drive 718, and optical disk drive 722 are each connected to the system bus 708 by one or more data media interfaces 726. Alternatively, the hard disk drive 716, magnetic disk drive 718, and optical disk drive 722 can be connected to the system bus 708 by one or more interfaces (not shown).

The disk drives and their associated computer-readable media provide non-volatile storage of computer readable instructions, data structures, program modules, and other data for computer 702. Although the example illustrates a hard disk 716, a removable magnetic disk 720, and a removable optical disk 724, it is to be appreciated that other types of computer readable media which can store data that is accessible by a computer, such as magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like, can also be utilized to implement the example computing system and environment.

Any number of program modules can be stored on the hard disk 716, magnetic disk 720, optical disk 724, ROM 712, and/or RAM 710, including by way of example, an operating system 726, one or more application programs 728, other program modules 730, and program data 732. Each of such operating system 726, one or more application programs 728, other program modules 730, and program data 732 (or some combination thereof) may implement all or part of the resident components that support the distributed file system.

A user can enter commands and information into computer 702 via input devices such as a keyboard 734 and a pointing device 736 (e.g., a "mouse"). Other input devices 738 (not shown specifically) may include a microphone, joystick, game pad, satellite dish, serial port, scanner, and/or the like. These and other input devices are connected to the processing unit 704 via input/output interfaces 740 that are coupled to the system bus 708, but may be connected by other interface and bus structures, such as a parallel port, game port, or a universal serial bus (USB).

A monitor 742 or other type of display device can also be connected to the system bus 708 via an interface, such as a video adapter 744. In addition to the monitor 742, other output peripheral devices can include components such as speakers (not shown) and a printer 746 which can be connected to computer 702 via the input/output interfaces 740.

Computer 702 can operate in a networked environment using logical connections to one or more remote computers, such as a remote computing device 748. By way of example, the remote computing device 748 can be a personal computer, portable computer, a server, a router, a network computer, a peer device or other common network node, game console, and the like. The remote computing device 748 is illustrated as a portable computer that can include many or all of the elements and features described herein relative to computer 702.

Logical connections between computer 702 and the remote computer 748 are depicted as a local area network (LAN) 750 and a general wide area network (WAN) 752. Such networking environments are commonplace in offices, enterprise-wide computer networks, intranets, and the Internet.

When implemented in a LAN networking environment, the computer 702 is connected to a local network 750 via a network interface or adapter 754. When implemented in a WAN networking environment, the computer 702 typically includes a modem 756 or other means for establishing communications over the wide network 752. The modem 756, which can be internal or external to computer 702, can be connected to the system bus 708 via the input/output interfaces 740 or other appropriate mechanisms. It is to be appreciated that the illustrated network connections are exemplary and that other means of establishing communication link(s) between the computers 702 and 748 can be employed.

In a networked environment, such as that illustrated with computing environment 700, program modules depicted relative to the computer 702, or portions thereof, may be stored in a remote memory storage device. By way of example, remote application programs 758 reside on a memory device of remote computer 748. For purposes of illustration, application programs and other executable program components such as the operating system are illustrated herein as discrete blocks, although it is recognized that such programs and components reside at various times in different storage components of the computing device 702, and are executed by the data processor(s) of the computer.

Various modules and techniques may be described herein in the general context of computer-executable instructions, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

An implementation of these modules and techniques may be stored on or transmitted across some form of computer readable media. Computer readable media can be any available media that can be accessed by a computer. By way of example, and not limitation, computer readable media may comprise "computer storage media" and "communications media."

"Computer storage media" includes volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embodies computer readable instructions, data structures, program modules, or other data in a modulated data signal, such as carrier wave or other transport mechanism. Communication media also includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

Although the description above uses language that is specific to structural features and/or methodological acts, it is to be understood that the invention defined in the appended claims is not limited to the specific features or acts described. Rather, the specific features and acts are disclosed as exemplary forms of implementing the invention.

The invention claimed is:

1. A method in a computing device, the method comprising:
   receiving a request to play an audio file;
   determining, in the computing device, whether volume normalization parameters associated with the audio file are stored in a media library;
   if the volume normalization parameters associated with the audio file are stored in the media library, retrieving the volume normalization parameters from the media library;
   if the volume normalization parameters associated with the audio file are not stored in the media library, retrieving the volume normalization parameters from the audio file, both the volume normalization parameters and audio data being stored in the audio file; and
   applying the volume normalization parameters while playing the audio file.

2. A method as recited in claim 1 wherein the volume normalization parameters are associated with a playback volume of the audio file.

3. A method as recited in claim 1 wherein the volume normalization parameters identify a mapping function.

4. A method as recited in claim 1 wherein the volume normalization parameters include a peak volume level associated with the audio file.

5. A method as recited in claim 1 wherein the volume normalization parameters include an average volume level associated with the audio file.

6. A method as recited in claim 1 further comprising if the volume normalization parameters associated with the audio file are not stored in the media library and are not in the audio file, calculating the volume normalization parameters while playing the audio file.

7. One or more computer storage devices having stored thereon multiple instructions that, when executed by one or more processors, cause the one or more processors to:
   receive a request to play an audio file;
   determine whether volume normalization parameters associated with the audio file are stored in a media library;
   if the volume normalization parameters associated with the audio file are stored in the media library, retrieve the volume normalization parameters from the media library;
   if the volume normalization parameters associated with the audio file are not stored in the media library, retrieve the volume normalization parameters from the audio file, both the volume normalization parameters and audio data being stored in the audio file; and apply the volume normalization parameters while playing the audio file.

8. One or more computer storage devices as recited in claim 7 wherein the volume normalization parameters are associated with a playback volume of the audio file.

9. One or more computer storage devices as recited in claim 7 wherein the volume normalization parameters identify a mapping function.

10. One or more computer storage devices as recited in claim 7 wherein the volume normalization parameters include a peak volume level associated with the audio file.

11. One or more computer storage devices as recited in claim 7 wherein the volume normalization parameters include an average volume level associated with the audio file.

12. One or more computer storage devices as recited in claim 7, the multiple instructions further causing the one or more processors to, if the volume normalization parameters associated with the audio file are not stored in the media library and are not in the audio file, calculate the volume normalization parameters while playing the audio file.

13. A device comprising:
one or more processors; and
one or more computer storage media having stored thereon multiple instructions that, when executed by the one or more processors, cause the one or more processors to:
receive a request to play an audio file;
determine whether volume normalization parameters associated with the audio file are stored in a media library;
if the volume normalization parameters associated with the audio file are stored in the media library, retrieve the volume normalization parameters from the media library;
if the volume normalization parameters associated with the audio file are not stored in the media library, retrieve the volume normalization parameters from the audio file, both the volume normalization parameters and audio data being stored in the audio file; and
apply the volume normalization parameters while playing the audio file.

14. A device as recited in claim 13 wherein the volume normalization parameters are associated with a playback volume of the audio file.

15. A device as recited in claim 13 wherein the volume normalization parameters identify a mapping function.

16. A device as recited in claim 13 wherein the volume normalization parameters include a peak volume level associated with the audio file.

17. A device as recited in claim 13 wherein the volume normalization parameters include an average volume level associated with the audio file.

18. A device as recited in claim 13, the multiple instructions further causing the one or more processors to, if the volume normalization parameters associated with the audio file are not stored in the media library and are not in the audio file, calculate the volume normalization parameters while playing the audio file.

* * * * *